(12) United States Patent
Gallagher et al.

(10) Patent No.: US 9,106,205 B2
(45) Date of Patent: Aug. 11, 2015

(54) WIRELESS SAW SENSORS HAVING INTEGRATED ANTENNAS

(75) Inventors: Mark Gallagher, Altamonte Springs, FL (US); Donald C. Malocha, Winter Springs, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 389 days.

(21) Appl. No.: 13/374,446

(22) Filed: Dec. 29, 2011

(65) Prior Publication Data

US 2012/0174678 A1 Jul. 12, 2012

Related U.S. Application Data

(60) Provisional application No. 61/427,889, filed on Dec. 29, 2010.

(51) Int. Cl.
*G01H 11/08* (2006.01)
*H04R 31/00* (2006.01)
*H03H 9/64* (2006.01)
*H04R 17/00* (2006.01)

(52) U.S. Cl.
CPC ............. *H03H 9/642* (2013.01); *H04R 17/00* (2013.01); *H04R 31/00* (2013.01); *Y10T 29/42* (2015.01)

(58) Field of Classification Search
CPC ......... H03H 9/642; H04R 31/00; H04R 17/00
USPC .................. 73/658, 649, 24.06, 31.06, 53.01; 310/313 B, 313 D
See application file for complete search history.

(56) References Cited

U.S. PATENT DOCUMENTS

| | | | |
|---|---|---|---|
| 4,021,705 A * | 5/1977 | Lichtblau | 361/765 |
| 4,035,675 A | 7/1977 | Malocha et al. | |
| 4,200,849 A | 4/1980 | Malocha | |
| 4,951,057 A * | 8/1990 | Nagel | 342/51 |
| 5,028,831 A | 7/1991 | Malocha et al. | |
| 5,034,793 A | 7/1991 | Malocha et al. | |
| 5,155,406 A | 10/1992 | Cho et al. | |
| 5,821,425 A * | 10/1998 | Mariani et al. | 73/703 |
| 7,005,987 B2 * | 2/2006 | Sinnett et al. | 340/572.1 |
| 7,042,418 B2 * | 5/2006 | Fujimura et al. | 343/895 |
| 7,105,980 B2 | 9/2006 | Abbott et al. | |
| 7,213,314 B2 | 5/2007 | Abbott et al. | |
| 7,267,009 B2 * | 9/2007 | Liu et al. | 73/649 |
| 7,322,243 B2 * | 1/2008 | Liu et al. | 73/579 |

(Continued)

FOREIGN PATENT DOCUMENTS

JP 09162694 * 6/1997

OTHER PUBLICATIONS

Puccio, et al. "SAW sensors using orthogonal frequency coding", Proc. IEEE International Frequency Control Symposium, 307-310, 2004.

(Continued)

*Primary Examiner* — J M Saint Surin
(74) *Attorney, Agent, or Firm* — Thomas | Horstemeyer, LLP (57) ABSTRACT

A wireless surface acoustic wave sensor includes a piezoelectric substrate, a surface acoustic wave device formed on the substrate, and an antenna formed on the substrate. In some embodiments, the antenna is formed on the surface of the substrate using one or more of photolithography, thin film processing, thick film processing, plating, and printing.

20 Claims, 7 Drawing Sheets

(56) References Cited

U.S. PATENT DOCUMENTS

| | | | |
|---|---|---|---|
| 7,343,804 B2 * | 3/2008 | Liu et al. | 73/649 |
| 7,399,280 B2 * | 7/2008 | Liu et al. | 600/504 |
| 7,623,037 B1 | 11/2009 | Malocha | |
| 7,642,898 B1 | 1/2010 | Malocha et al. | |
| 7,777,625 B1 | 8/2010 | Puccio et al. | |
| 8,284,579 B2 * | 10/2012 | Shionoiri | 363/125 |
| 8,299,679 B2 * | 10/2012 | Chommeloux et al. | 310/313 R |
| 8,339,219 B1 * | 12/2012 | Skinner et al. | 333/193 |
| 2010/0066495 A1 | 3/2010 | Malocha | |
| 2010/0117804 A1 | 5/2010 | Malocha | |
| 2013/0036821 A1 * | 2/2013 | Belkerdid et al. | 73/627 |

OTHER PUBLICATIONS

Gallagher, et al. "Spread spectrum orthogonal frequency coded SAW tags and sensors using harmonic operation", Proc. IEEE International Microwave Symposium, 105-108, 2009.

Kozlovski "Saw passive wireless multi sensor system" Proc. IEEE International Ultrasonics Symposium, 2009.

Lopez "Fundamental limitations of small antennas: Validation of wheeler's formulas" IEEE Antennas Propag. Mag., 48:28-36, 2006.

Malocha, et al. "Orthogonal frequency coded SAW sensors and RFID design principles" Proc. IEEE International Frequency Control Symposium, 278-283, 2008.

Honda, et al. "A disk monopole antenna with 1:8 impedance bandwidth and omnidirectional radiation pattern" Proc. IEEE International Symposium on Antennas and Propagation, 1992.

Lopez "Wheeler and fano impedance matching" IEEE Antennas Propag. Mag., 49(4):116-119, 2007.

King, et al. "An experimental study of a balun-fed open-sleeve dipole in front of a metallic reflector" IEEE Trans. Antennas Propag., 20(2):201-204, 1972.

Trifunovic, et al. "Review of printed Marchand and double Y baluns: characteristics and application" IEEE Trans. Microw. Theory Tech., 42(8):1454-1462, 1994.

Lindberg, et al. "Dual wideband printed dipole antenna with integrated balun" Microwave, Antennas and Propagation, IET, 1(3):707-711, 2007.

Puente, et al. "Resonant frequency calculation of meander dipole anteannas by TLM" Microwave and Optical Technology Letters, 50(5):1707-1712, 2008.

Gallagher, et al. "Wireless Wideband SAW Sensor—Antenna Design" IEEE International Frequency Control Symposium, 291-296, 2010.

\* cited by examiner

WIRELESS SAW SENSORS HAVING INTEGRATED ANTENNAS

CROSS-REFERENCE TO RELATED APPLICATION

This application is related to copending U.S. provisional patent application entitled "Wireless Saw Sensors Having Integrated Antennas", filed on Dec. 29, 2010 and accorded Ser. No. 61/427,889, which is entirely incorporated herein by reference.

NOTICE OF GOVERNMENT-SPONSORED RESEARCH

This invention was made with Government support under Contract/Grant No.: NNX08AZ4H, awarded by NASA. The Government has rights in the claimed inventions.

BACKGROUND

Surface acoustic wave (SAW) devices are used in various applications. For example, SAW devices can be used as sensors to measure various parameters, such as pressure, humidity, mass, and temperature, to name a few. Because SAW devices are passively energized, they do not require batteries and they can be easily integrated into a data acquisition system.

Many SAW sensors are configured for wireless operation. In such a case, the SAW sensor can receive high-frequency electromagnetic waves emitted by a radio frequency (RF) transceiver, as well as transmit a response signal back to the transceiver. In a typical sensor, the SAW device is formed on a piezoelectric substrate that is mounted to separate a printed circuit board (PCB) to which an independent antenna is also mounted or otherwise connected.

With conventional wireless SAW sensors, the SAW device must be coupled to the antenna with some form of external interconnect that is soldered or bonded in place. Unfortunately, such external interconnects are vulnerable to damage, particularly in extreme environments, for instance in high-temperature environments.

BRIEF DESCRIPTION OF THE FIGURES

The present disclosure may be better understood with reference to the following figures. Matching reference numerals designate corresponding parts throughout the figures, which are not necessarily drawn to scale.

DETAILED DESCRIPTION

As described above, existing wireless surface acoustic wave (SAW) sensors typically comprise antennas that are independent of the SAW device and its substrate, and therefore must be coupled to the SAW device with an external interconnect. Although such a configuration is viable in some situations, external interconnects are vulnerable to damage, particularly in extreme environments, such as high-temperature environments. As described below, disclosed herein are wireless SAW sensors that incorporate integral antennas that are formed directly on the same piezoelectric substrate as the SAW device, typically using the same or a similar fabrication process used to create the SAW device. Because the antenna is formed directly on the piezoelectric substrate of the SAW device, no external interconnects are required and the wireless SAW sensor is more robust.

Figure 1:
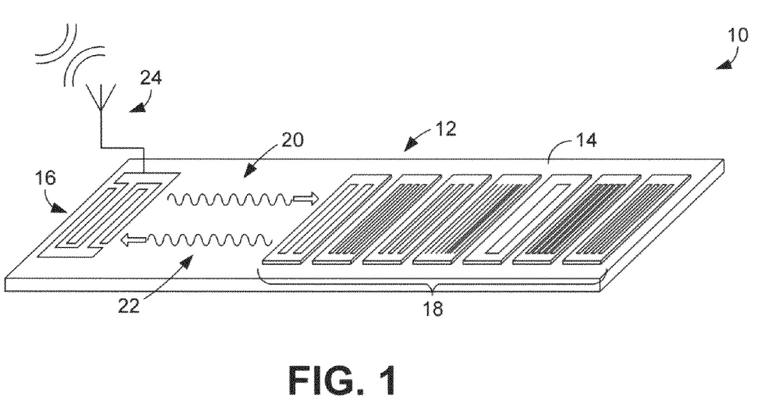
FIG. 1 is a schematic perspective view of an embodiment of a surface acoustic wave (SAW) device that can be used to form a wireless SAW sensor.

FIG. 1 illustrates an example SAW device 10. As is shown in that figure, the device 10 comprises a substrate 12 (i.e., the SAW substrate) that is formed of a piezoelectric material, such as quartz, lithium niobate, lithium tantalate, or lanthanum gallium silicate. Formed on a surface 14 of the substrate 12 is an interdigital transducer 16 that converts acoustic waves into electrical signals and vice versa. Also formed on the surface 14 of the substrate 12 are multiple reflector gratings 18 that reflect input signals 20 propagated by the transducer 16 and return response signals 22 to the transducer. The transducer 16 wirelessly receives the input signals 20 and wirelessly transmits the response signals 22 using an antenna 24 that is electrically coupled to the transducer.

In a conventional wireless SAW sensor, the antenna 24 would comprise an independent component that is separate from the substrate 12 and that is electrically coupled to the SAW device 10 using an external interconnect. For the wireless SAW sensors of this disclosure, however, the antenna 24 is integrally formed with the SAW device directly on the substrate 12 on which the SAW device is formed. In some embodiments, the SAW device and the antenna are formed on the substrate 12 using the same or similar fabrication steps. For instance, the antenna can be directly formed on the SAW substrate 12 using a monolithic fabrication process typically used to form integrated circuits, such a photolithographic process, a thin film process, a thick film process, a plating process, or a printing process. Example wireless SAW sensors that include integral antennas that are formed directly on the SAW substrate are illustrated in FIGS. 2-7.

Figure 2:
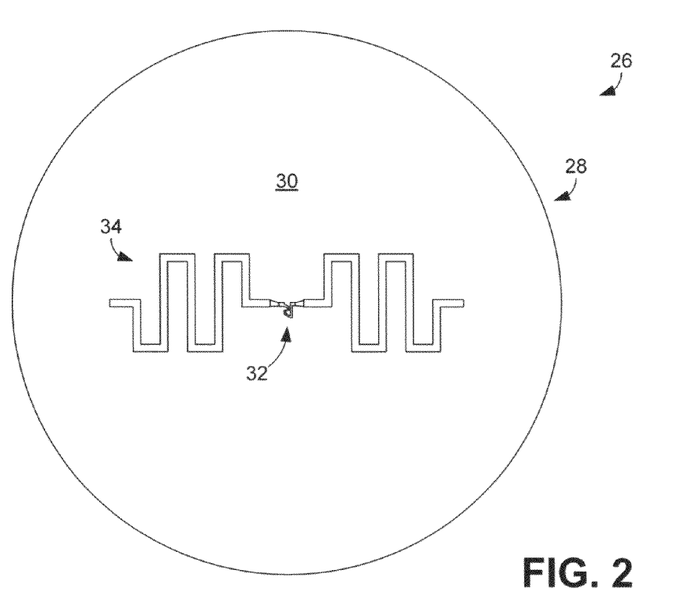
FIG. 2 is a top view of a first embodiment of a wireless SAW sensor including a piezoelectric substrate on which both a SAW device and an antenna are formed.

FIG. 2 illustrates a first example wireless SAW sensor 26. As is shown in that figure, the sensor 26 comprises a wafer substrate 28 having an outer surface 30. The substrate 28 is formed of a piezoelectric material, such as quartz, lithium niobate, lithium tantalate, or lanthanum gallium silicate, and can be of a standard size, such as approximately three or four inches in diameter. Formed on the surface 30 of the substrate 28 is a SAW device 32, which can have a configuration similar to that of the device 10 shown in FIG. 1. Of course, alternative configurations are possible for the SAW device 32. As is further illustrated in FIG. 2, the sensor 26 also comprises a meandered dipole antenna 34 that is formed directly on the surface 30 of the substrate 28 using a suitable fabrication technique, such as photolithography, thin film processing, thick film processing, plating, or printing. Although those particular processes have been explicitly identified, it is to be understood that any process through which the antenna 34 is formed directly on the SAW substrate 28 can be used. By way of example, the antenna 34 can be composed of copper, titanium, gold, platinum, zirconia, or palladium. Each pole of the antenna 34 is electrically coupled to the SAW device 32. In some embodiments, an intermediate circuit, such as a matching network or phasing network, is provided between the SAW device 32 and the antenna 34.

Figure 3:
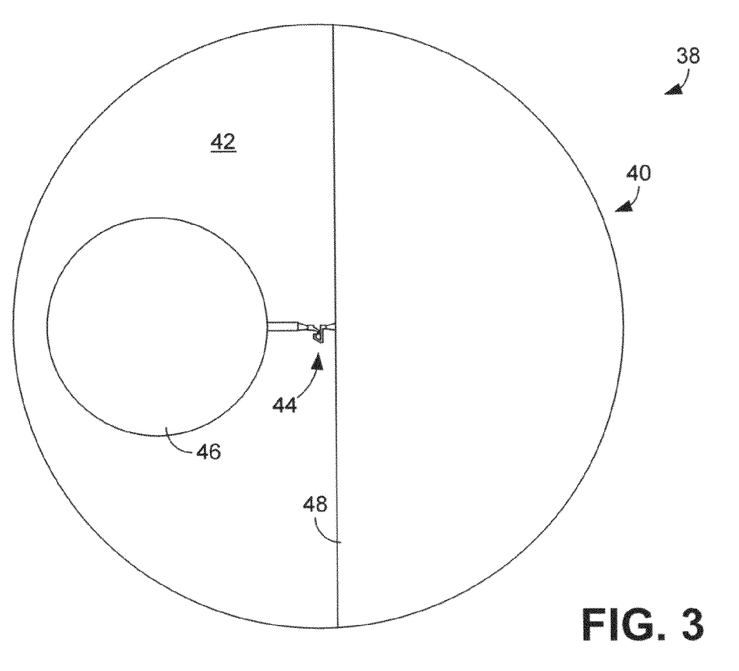
FIG. 3 is a top view of a second embodiment of a wireless SAW sensor including a piezoelectric substrate on which both a SAW device and an antenna are formed.

FIG. 3 illustrates a second example wireless SAW sensor 38. The sensor 38 is similar to the sensor 26 in several ways. Therefore, the sensor 38 comprises a piezoelectric substrate 40 having an outer surface 42 on which is formed a SAW device 44. The sensor 38, however, comprises a disk monopole antenna 46 and a ground plane 48 that are also formed on the surface 42 of the substrate 40. As with the sensor 26, the antenna 46 is formed directly on the surface 42 of the SAW substrate 40 using a suitable fabrication technique, such as photolithography, thin film processing, thick film processing, plating, printing, or other technique through which the antenna is directly formed on the substrate. As is shown in FIG. 3, each of the antenna 46 and the ground plane 48 is electrically coupled to the SAW device 44.

Figure 4:
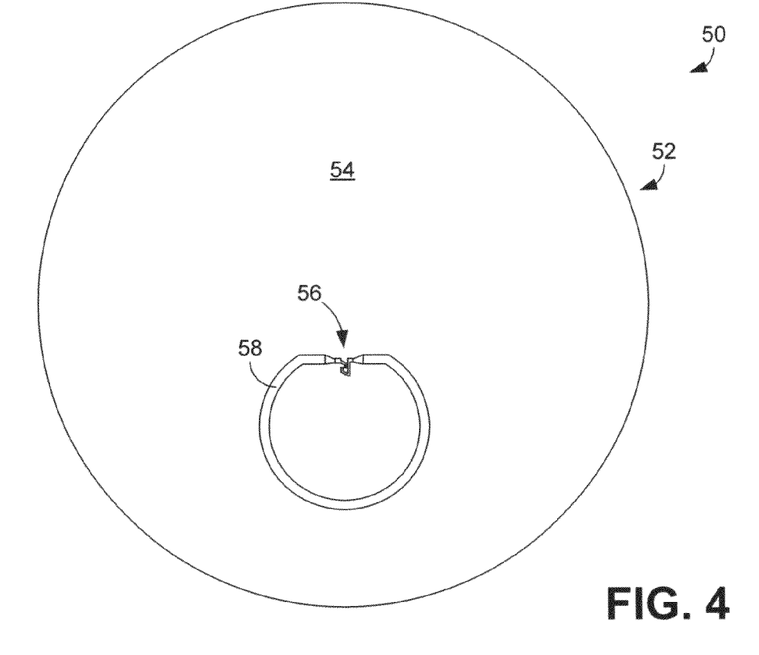
FIG. 4 is a top view of a third embodiment of a wireless SAW sensor including a piezoelectric substrate on which both a SAW device and an antenna are formed.

Referring next to FIG. 4, illustrated is a third example wireless SAW sensor 50. The sensor 50 also comprises a piezoelectric substrate 52 having an outer surface 54 on which is formed a SAW device 56. The sensor 50, however, comprises a loop antenna 58 that is also formed on the surface 54 of the substrate 52 and that is electrically coupled to the SAW device 56. As with the sensor 26, the antenna 58 is formed directly on the surface 54 of the SAW substrate 52 using a suitable fabrication technique, such as photolithography, thin film processing, thick film processing, plating, printing, or other technique through which the antenna is directly formed on the substrate.

Figure 5:
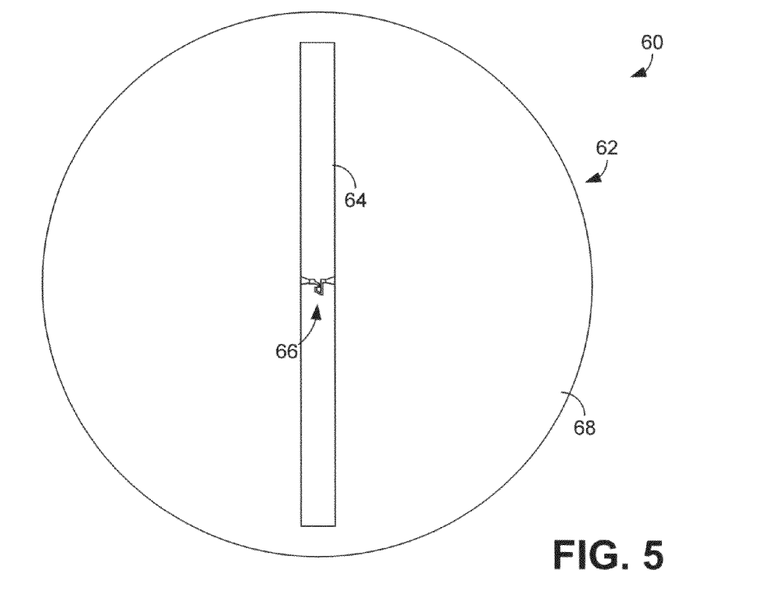
FIG. 5 is a top view of a fourth embodiment of a wireless SAW sensor including a piezoelectric substrate on which both a SAW device and an antenna are formed.

FIG. 5 illustrates a fourth example wireless SAW sensor 60. The sensor 60 comprises a piezoelectric substrate 62 having an outer surface (not visible in the figure) in which a slot 64 is formed. Formed in the slot 64 is a SAW device 66 that is electrically coupled to a surface antenna 68 (a "slot" antenna) that covers substantially the entire outer surface of the substrate 62. As with the sensor 26, the antenna 68 is formed directly on the surface of the SAW substrate 62 using a suitable fabrication technique, such as photolithography, thin film processing, thick film processing, plating, printing, or other technique through which the antenna is directly formed on the substrate.

Figure 6:
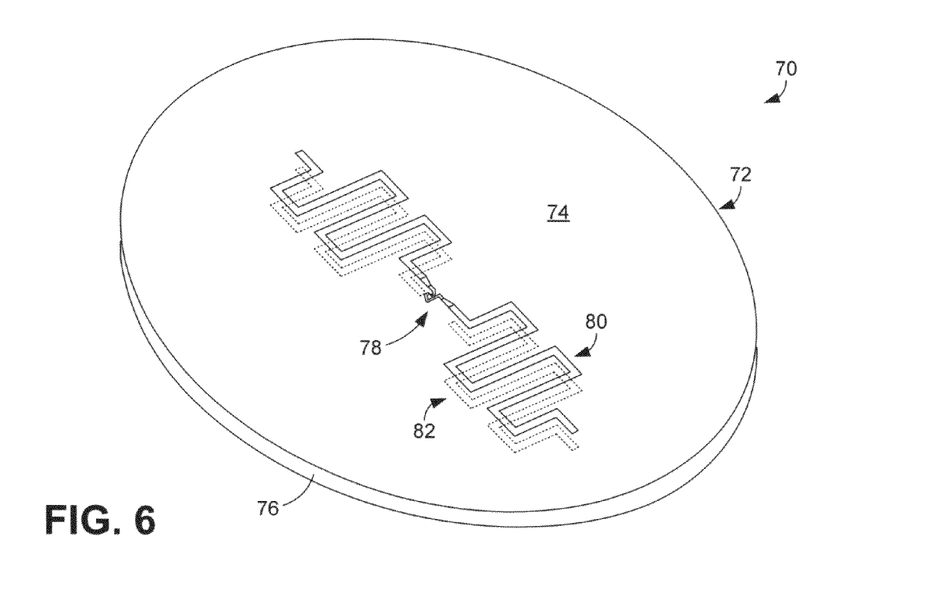
FIG. 6 is a top view of a fifth embodiment of an integrated wireless SAW sensor including a piezoelectric substrate on which both a SAW device and an antenna are formed.

Illustrated in FIG. 6 is a fifth example wireless SAW sensor 70. The sensor 70 comprises a piezoelectric substrate 72 having first or top surface 74 and second or bottom surface 76. In some embodiments, the surfaces 74, 76 are substantially parallel. Formed on the top surface 74 is a SAW device 78 and a first meandered dipole antenna 80 that is similar to the antenna 34 shown in FIG. 2. Each pole of the antenna 80 is electrically coupled to the SAW device 78. Formed on the bottom surface 76, in substantial registration with the first meandered dipole antenna 80, is a second meandered dipole antenna 82 that has the same configuration of the first meandered dipole antenna. Each antenna 80, 82 is formed directly a surface 74, 76 of the SAW substrate 72 using a suitable fabrication technique, such as photolithography, thin film processing, thick film processing, plating, printing, or other technique through which the antenna is directly formed on the substrate.

Figure 7A:
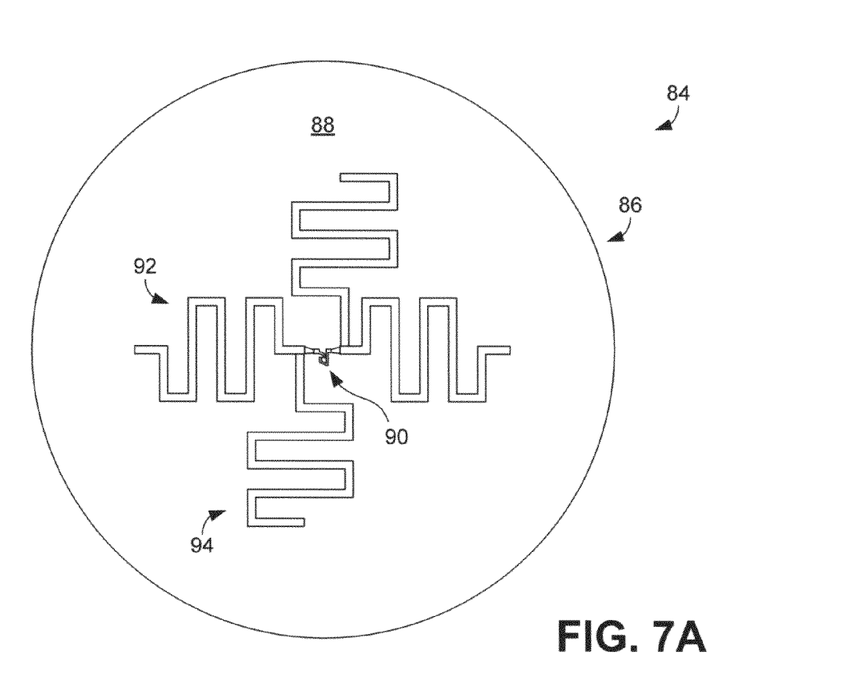
FIGS. 7A and 7B are top views of a sixth and seventh embodiment of a wireless SAW sensor including a piezoelectric substrate on which both a SAW device and an antenna are formed.
Figure 7B:
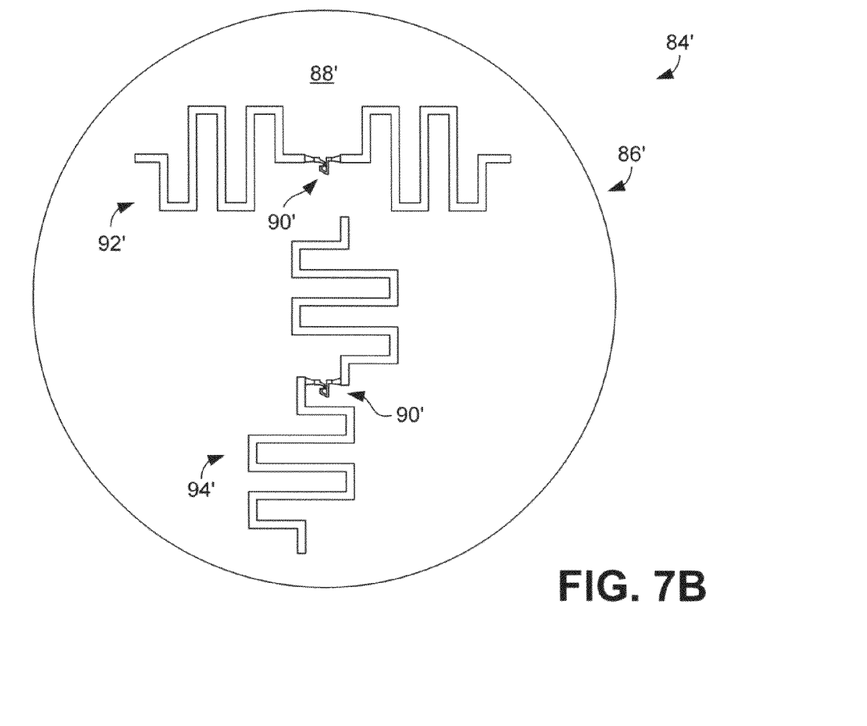

FIG. 7A shows a sixth example wireless SAW sensor 84. The sensor 84 comprises a piezoelectric substrate 86 having an outer surface 88 on which is formed a SAW device 90. Also formed on the surface 88 of the substrate 86 are two meandered dipole antennas 92 and 94 that are orthogonally oriented relative to each other so as to be cross polarized. FIG. 7B, shows a seventh example wireless SAW sensor 84'. The sensor 84' comprises a piezoelectric substrate 86' having an outer surface 88'. Like the sensor 84, the sensor 84' comprises two meandered dipole antennas 92' and 94' that are orthogonally oriented relative to each other. Each antenna 92', 94' is connected to a SAW device 90' that is formed on the surface 88' of the substrate 86'. For both sensors 84 and 84' shown in FIGS. 7A and 7B, respectively, the antennas are formed directly on the surfaces of their respective SAW substrates using a suitable fabrication technique, such as photolithography, thin film processing, thick film processing, plating, printing, or other technique through which the antenna is directly formed on the substrate.

Testing was performed to validate the integrated antenna concept described above. Specifically, a meandered dipole antenna was formed on a YZ-LiNbO$_3$ SAW substrate to form a 915 megahertz (MHz) orthogonal frequency coded (OFC) SAW sensor. For simplicity, a constant substrate permittivity $\epsilon_r$ of 43.9 was assumed in the design process and a dipole structure was chosen for the first iteration design. For an infinitely thick substrate, the wavelength of an antenna on the surface of a wafer would be given by:

$$\lambda_{ant} = \frac{\lambda_{air}}{\varepsilon_{eff}} \qquad \text{Equation 1}$$

where $\epsilon_{eff}$ is the average permittivity of air and the antenna substrate, lithium niobate. However, for a thin substrate with a high permittivity, the ends of the dipole arms add significant capacitance that decrease the effective length of the dipole. For example, the wavelength (λ) at 915 MHz of an antenna on a 0.5 millimeter (mm) thick substrate with an $\epsilon_r$ of 43.9 is 190 mm. When compared to the free space wavelength of 330 mm, this gives an $\in_{eff}$ of approximately 3. Although the antenna may be smaller on a higher permittivity material, the radiation efficiency will decrease as more reactive energy is stored.

Since the length necessary for a simple dipole antenna on YZ-LiNbO$_3$ was determined to be longer than the 76.2 mm wafer used, a means to decrease the resonant frequency of a physically shorter dipole was used. Meander line dipole antennas can be used to decrease antenna footprint. The structure of the antenna can be viewed as a transmission line with the meanders serving as stub tuning elements that inductively tune the antenna. At lengths less than the resonant length of λ/2, a regular dipole antenna has a large capacitive reactance. By inductively tuning the antenna with meandered sections, the resonance of the antenna occurs at shorter conductor lengths.

Figure 8:
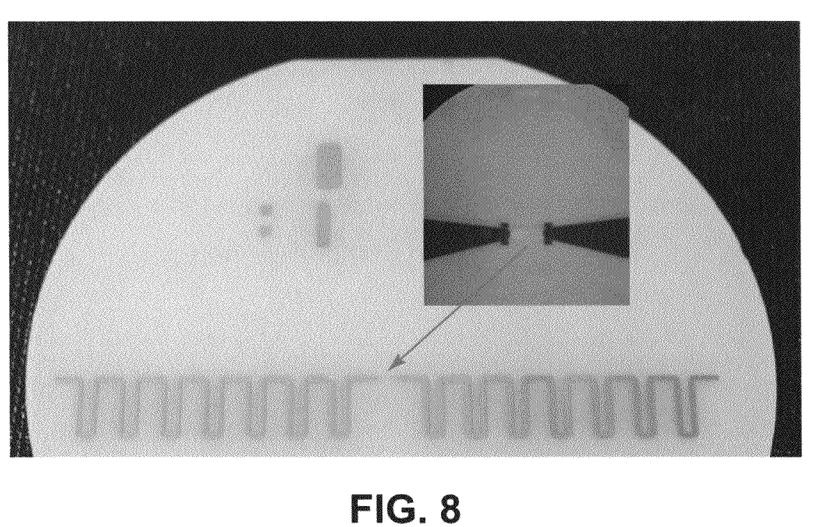
FIG. 8 is a photograph of an example wireless SAW sensor that was formed using a meander line dipole antenna.

FIG. 8 is a photograph of an example meander line dipole antenna that was fabricated on YZ-LiNbO$_3$ and differentially connected directly to a SAW transducer with a 100 $\lambda_0$ beam width. A trace width of 0.5 mm was chosen for the dipole. The initial metallization of the dipole traces used a relatively thin, 0.35 micron (μm), layer of copper. Since the skin depth of copper at 915 MHz is closer to 2 μm, the conductor losses were relatively high on this antenna. However, for this experiment, the primary concern was proving the ability to implement an antenna with a 50 ohm (Ω) input impedance on a SAW substrate. The metallization thickness and trace width can be optimized for an optimum impedance and efficiency when connected to the SAW transducer.

Figure 9:
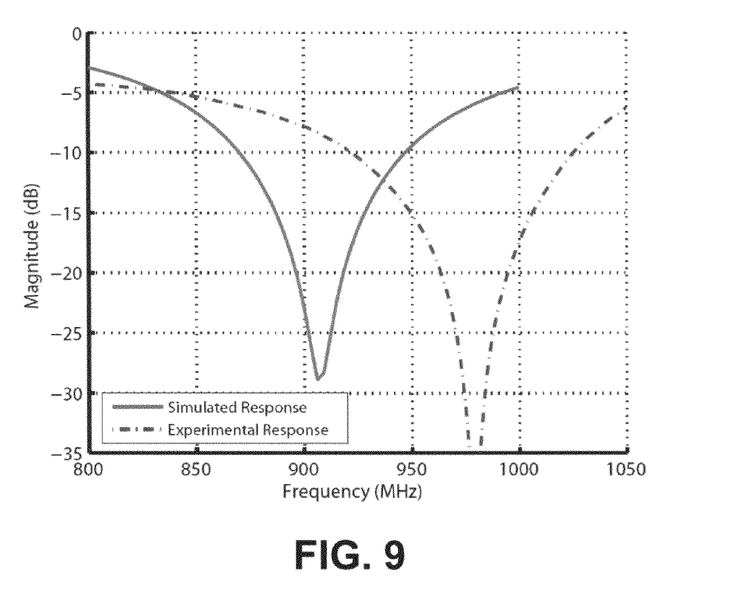
FIG. 9 is a graph of an antenna reflection coefficient comparison between an IE3D simulation (solid line) and experimental results (dashed line) for the on-wafer meander line-dipole antenna of FIG. 8.

A separate antenna without the SAW device was fabricated for extraction of input impedance and gain. A differential vector network analyzer (VNA) was employed to extract the S$_{11}$ response shown in FIG. 9. The bandwidth of the antenna was around 10%, which is sufficient for the designed OFC device. The shift in center frequency between the simulation and experimental responses is likely due to the anisotropic nature of the substrate and the necessity to trim the wafer footprint for connection to the VNA. Gain measurements were performed at a separation of 76 centimeters (cm) and a gain of approximately −4 dB was observed. The maximum efficiency that can be achieved with optimized designs using metal films or multilayer dielectrics would be sufficient for most sensor applications.

Figure 10:
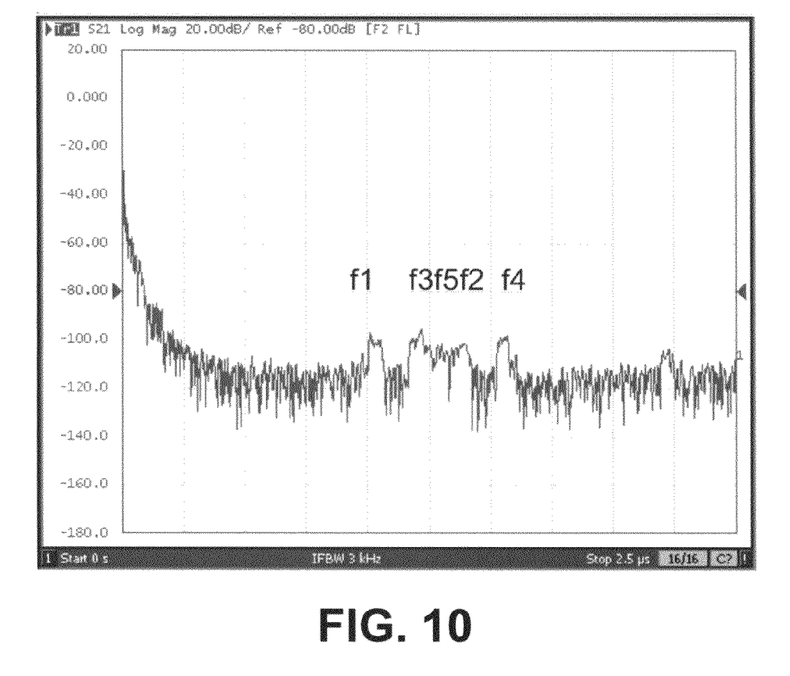
FIG. 10 is a plot of the S21 measurement of an integrated sensor with an on-wafer antenna, interrogated at a separation of 25 cm.

In order to verify the ability of the wafer to operate as an OFC sensor, a simple VNA S$_{21}$ measurement was performed at a separation of 25 cm for chip verification in the time domain. Dipole antennas were used for the transmit and receive antennas with an output power of 20 dBm. The plot in FIG. 10 shows fairly constant chip amplitude through all five chips, f$_1$, f$_3$, f$_5$, f$_2$, and f$_4$. These results indicate that, through continued optimization, the on-wafer integrated SAW-antenna sensor could be used in a multi-tag transceiver system.

Figure 11:
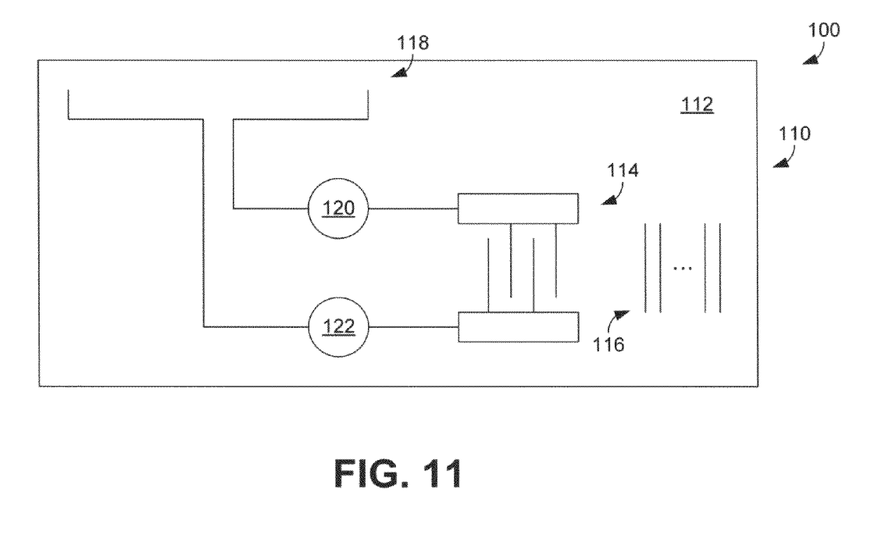
FIG. 11 is a schematic view of a SAW sensor that incorporates an independent sensor.

In other embodiments, an independent, monolithic sensor can be integrated with the SAW sensor. FIG. 11 schematically illustrates an example of such an embodiment. As is shown in FIG. 11, a SAW sensor 100 comprises a piezoelectric substrate 110 (i.e., SAW substrate). The substrate 110 defines a surface 112 on which is formed a SAW transducer 114 and SAW reflectors 116, which encode the sensor identifier (ID). Also formed directly on the surface 112 of the SAW substrate 110 is an antenna 118, which is schematically depicted as comprising a dipole antenna. Although a dipole antenna is depicted, it is noted that substantially any other antenna can be formed on the substrate surface 112.

As is further illustrated in FIG. 11, the SAW sensor 100 further includes a first independent sensor 120 that is interposed between a first port of the SAW transducer 114 and the antenna 118. By way of example, the first independent sensor 120 can be adapted to sense hydrogen. Furthermore, the SAW sensor 100 includes a second independent sensor 122 that is interposed between a second port of the SAW transducer 113 and the antenna 118. As with the other embodiments of this disclosure, each of the above components, including the antenna 118 and the independent sensors 120, 122 can be formed on the substrate 110 using a fabrication technique such as photolithography, thin film processing, thick film processing, plating, printing, or other technique through which the components are directly formed on the substrate.

Figure 12:
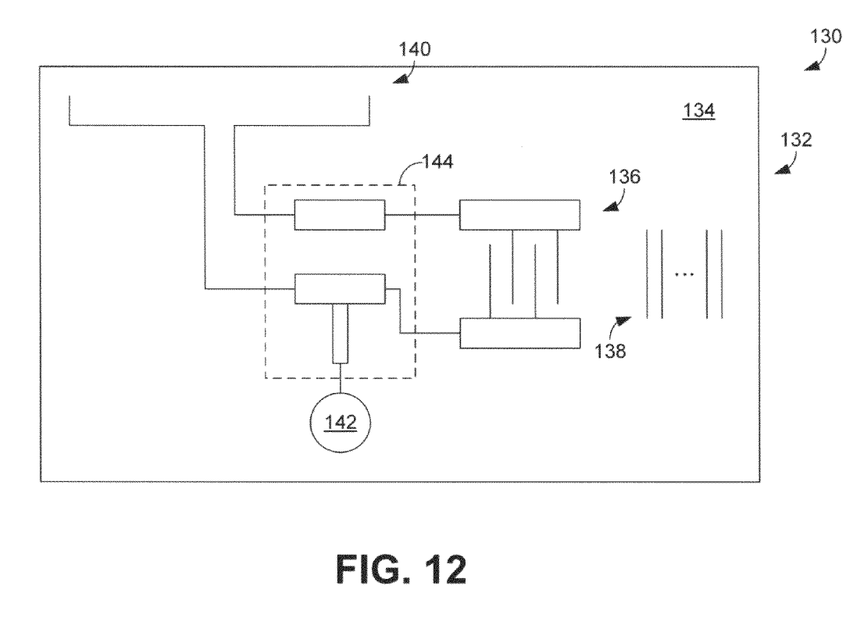
FIG. 12 is a schematic view of a SAW sensor that incorporates an independent sensor and a matching network.

FIG. 12 schematically illustrates a further example of an embodiment in which an independent sensor and a matching network are integrated with the SAW sensor. As is shown in FIG. 12, the SAW sensor 130 comprises a piezoelectric substrate 132 (i.e., SAW substrate). The substrate 132 defines a surface 134 on which is formed a SAW transducer 136 and SAW reflectors 138. Also formed directly on the surface 134 of the SAW substrate 132 is an antenna 140, which is schematically depicted as comprising a dipole antenna. Although a dipole antenna is depicted, it is noted that substantially any other antenna can be formed on the substrate surface 134.

As is further illustrated in FIG. 12, the SAW sensor 130 includes an independent sensor 142 that is interposed between a first port of the SAW transducer 136 and the antenna 140. In addition, the SAW sensor 130 includes a matching network 144 that is interposed between a second port of the SAW transducer 136 and the antenna 140. By way of example, the matching network 144 comprises a strip line with stub matching and the sensor 142 is connected to the stub. As the impedance of the sensor 142 changes, the load on the stub changes and modulates the matching network 144, which changes the transmitted signal. It is noted that additional components could be integrated onto the substrate 132 to tailor the desired impedances, such as a parallel thin-film inductor to provide a series or parallel resonance at the stub end. As with the other embodiments of this disclosure, each of the above components can be formed on the substrate 132 using a fabrication technique such as photolithography, thin film processing, thick film processing, plating, printing, or other technique through which the components are directly formed on the substrate.

Various specific embodiments of wireless SAW sensors have been described and illustrated herein. It is to be understood that those embodiments are mere example implementations of the disclosed inventions. Accordingly, this disclosure is not intended to be limited to the illustrated embodiments and instead is intended to extend to any wireless SAW sensor that includes an integrated antenna that is formed directly on the same piezoelectric substrate on which the SAW device is formed.

The invention claimed is:

1. A wireless surface acoustic wave sensor comprising:
   a piezoelectric substrate having an outer surface;
   a surface acoustic wave device formed on the substrate outer surface, the device comprising a transducer and a reflector grating both formed directly on the substrate;
   a planar antenna formed on the substrate outer surface, wherein the antenna is wholly contained on the outer surface; and
   an independent sensor formed on the substrate outer surface and interposed between the transducer and the antenna.

2. The sensor of claim 1, wherein the piezoelectric substrate is composed of one or more of quartz, lithium niobate, lithium tantalate, and lanthanum gallium silicate.

3. The sensor of claim 1, wherein the surface acoustic wave device comprises a transducer formed on the substrate outer surface.

4. The sensor of claim 3, wherein the surface acoustic wave device further comprises a reflector grating formed on the substrate outer surface.

5. The sensor of claim 3, further comprising a matching network formed on the substrate outer surface and interposed between the transducer and the antenna.

6. The sensor of claim 1, wherein the planar antenna is directly formed on the surface of the substrate using one or more of photolithography, thin film processing, thick film processing, plating, and printing.

7. The sensor of claim 1, wherein the antenna is composed of one or more of copper, titanium, gold, platinum, zirconia, or palladium.

8. The sensor of claim 1, wherein the antenna is a meandered dipole antenna.

9. The sensor of claim 1, wherein the antenna is a disk monopole antenna.

10. The sensor of claim 1, wherein the antenna is a loop antenna.

11. The sensor of claim 1, wherein the antenna is a slot antenna.

12. The sensor of claim 1, further comprising a second planar antenna formed on the substrate outer surface.

13. The sensor of claim 12, wherein the second planar antenna is formed on the same side of the substrate as the first planar antenna.

14. The sensor of claim 13, wherein the second planar antenna is orthogonal to the first antenna.

15. The sensor of claim 12, further comprising a second planar antenna the second planar antenna that is formed on a second outer surface of the substrate that is opposite to the first outer surface.

16. The sensor of claim 1, further comprising a second independent sensor formed on the substrate outer surface and interposed between the transducer and the antenna.

17. The sensor of claim 1, further comprising a matching network interposed between the transducer and the antenna.

18. The sensor of claim 17, wherein the matching network comprises a strip line and a stub.

19. The sensor of claim 18, wherein the independent sensor is connected to the stub.

20. A method for making a wireless surface acoustic wave sensor, the method comprising:
    forming a piezoelectric substrate having a surface;
    forming a surface acoustic wave device directly on the surface of the substrate, the device comprising a transducer and a reflector grating;
    forming a planar antenna directly on the surface of the substrate using one or more of photolithography, thin film processing, thick film processing, plating, and printing such that the antenna is wholly contained on the substrate; and
    forming an independent sensor directly on the surface of the substrate interposed between the transducer and the antenna.

* * * * *